United States Patent
Karmaker et al.

(10) Patent No.: US 10,608,601 B2
(45) Date of Patent: Mar. 31, 2020

(54) ACTIVE BIQUAD FILTER WITH OSCILLATOR CIRCUIT

(71) Applicant: QUALCOMM Incorporated, San Diego, CA (US)

(72) Inventors: Rahul Karmaker, San Diego, CA (US); Gary Lee Brown, Jr., Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 318 days.

(21) Appl. No.: 15/609,951

(22) Filed: May 31, 2017

(65) Prior Publication Data

US 2018/0351535 A1 Dec. 6, 2018

(51) Int. Cl.
*H03K 3/26* (2006.01)
*H03F 3/19* (2006.01)
*H03H 11/12* (2006.01)
*H03F 3/24* (2006.01)
*H03F 3/45* (2006.01)
*H03F 3/195* (2006.01)

(52) U.S. Cl.
CPC .............. *H03F 3/19* (2013.01); *H03F 3/195* (2013.01); *H03F 3/245* (2013.01); *H03F 3/45475* (2013.01); *H03H 11/1256* (2013.01); *H03F 2200/408* (2013.01); *H03F 2200/451* (2013.01); *H03F 2203/45526* (2013.01); *H03H 2210/012* (2013.01); *H03H 2210/015* (2013.01); *H03H 2210/025* (2013.01); *H03H 2210/028* (2013.01); *H03H 2210/04* (2013.01)

(58) Field of Classification Search
CPC ...... H03F 3/19; H03F 2200/451; H03F 3/195; H03F 3/45475; H03F 3/245; H03F 2200/408; H03F 2203/45526; H03H 11/1256; H03H 2210/028; H03H 2210/04; H03H 2210/015; H03H 2210/012; H03H 2210/025
USPC ..................................................... 331/77, 111
See application file for complete search history.

(56) References Cited

U.S. PATENT DOCUMENTS

| | | | |
|---|---|---|---|
| 5,625,317 | A | 4/1997 | Deveirman |
| 7,474,160 | B2 | 1/2009 | Erdogan et al. |
| 8,487,693 | B2 | 7/2013 | Sanduleanu et al. |
| 8,810,307 | B2 | 8/2014 | Piazza et al. |
| 9,419,587 | B1 * | 8/2016 | Xu .................... H03H 11/0472 |

(Continued)

OTHER PUBLICATIONS

Jaikla W., "A Versatile Quadrature Oscillator and Universal Biquad Filter Using Dual-Output Current Controlled Current Differencing Transconductance Amplifier", International Symposium on Communications and Information Technologies, 2006, pp. 1-3.

*Primary Examiner* — Richard Tan
(74) *Attorney, Agent, or Firm* — Holland & Hart LLP-CLX/Qualcomm

(57) ABSTRACT

Certain aspects of the present disclosure are generally directed to a tunable active filter and a method of calibrating a tunable active filter. One example apparatus is a filter circuit that generally includes a resistor-capacitor (RC) topology tunable active filter comprising a first amplifier, a second amplifier, and a feedback path coupled between an input of the first amplifier and an output of the second amplifier. The filter circuit also includes a negative transconductance circuit coupled to a first node of the tunable active filter.

29 Claims, 12 Drawing Sheets

(56) References Cited

U.S. PATENT DOCUMENTS

| | | | |
|---|---|---|---|
| 9,729,126 B2* | 8/2017 | Guimaraes | H03F 3/193 |
| 2009/0066431 A1* | 3/2009 | Shin | H03B 5/1852 |
| | | | 331/117 FE |
| 2009/0108947 A1* | 4/2009 | Liu | H03B 5/1228 |
| | | | 331/117 FE |
| 2011/0241797 A1* | 10/2011 | Shana'a | H03H 7/40 |
| | | | 333/174 |
| 2015/0062081 A1* | 3/2015 | Lee | G06F 3/0412 |
| | | | 345/174 |

* cited by examiner

ACTIVE BIQUAD FILTER WITH OSCILLATOR CIRCUIT

TECHNICAL FIELD

Certain aspects of the present disclosure generally relate to electronic circuits and, more particularly, to calibrating a tunable active filter.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, $3^{rd}$ Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

MSs and/or BSs may include a tunable active filter used, for example, as a baseband filter in a receive chain or a transmit chain. The tunable active filter may be tuned to vary the center frequency ($f_0$) of the filter over a range of frequencies. For high quality factor (Q) and high $f_0$ filters, the Q and $f_0$ may vary due to process variations, mismatch, and limited operational amplifier (op amp) unity gain bandwidth (UGB). Therefore, it may be desirable to calibrate the tunable active filter.

SUMMARY

Certain aspects of the present disclosure generally relate to a tunable active filter. For certain aspects, the tunable active filter may be configured in an oscillation mode using a negative transconductance circuit.

Certain aspects of the present disclosure provide a filter circuit. The filter circuit generally includes a resistor-capacitor (RC) topology tunable active filter including a first amplifier, a second amplifier, and a feedback path coupled between an input of the first amplifier and an output of the second amplifier. The filter circuit also includes a negative transconductance circuit coupled to a first node of the tunable active filter.

Certain aspects of the present disclosure provide a method for calibrating a biquad filter. The method generally includes determining an error value of an impedance of an element of the biquad filter, the error value being associated with a quality factor (Q) of the biquad filter at a frequency, determining one or more other error values associated with the Q of the biquad filter at one or more other frequencies, and generating one or more calibration parameters corresponding to the impedance of the element of the biquad filter at the one or more other frequencies based on the error value and the one or more other error values.

Certain aspects of the present disclosure provide an apparatus for generating an oscillating signal. The apparatus generally includes first means for amplifying an input signal and second means for amplifying an output signal of the first means for amplifying, the input signal being based on feedback signal generated based on an output of the second means for amplifying, and the first and second means for amplifying being part of a tunable active filter having a resistor-capacitor (RC) topology. The apparatus also includes means for providing negative transconductance to counteract losses of the tunable active filter to generate the oscillating signal.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
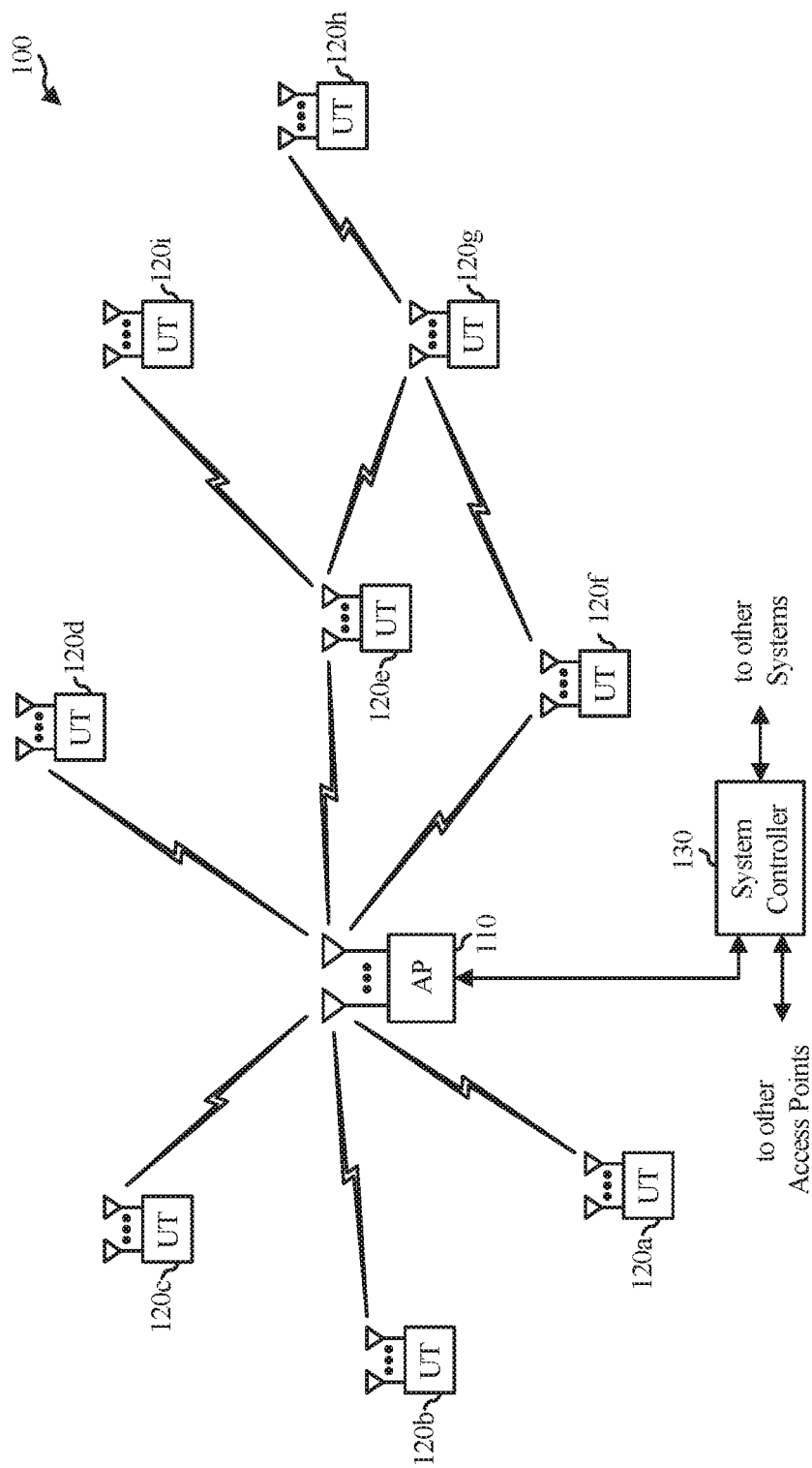
FIG. 1 is a diagram of an example wireless communications network, in accordance with certain aspects of the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

In certain aspects of the present disclosure, the access point 110 and/or user terminal 120 may include at least one tunable active filter coupled to a negative transconductance circuit.

Figure 2:
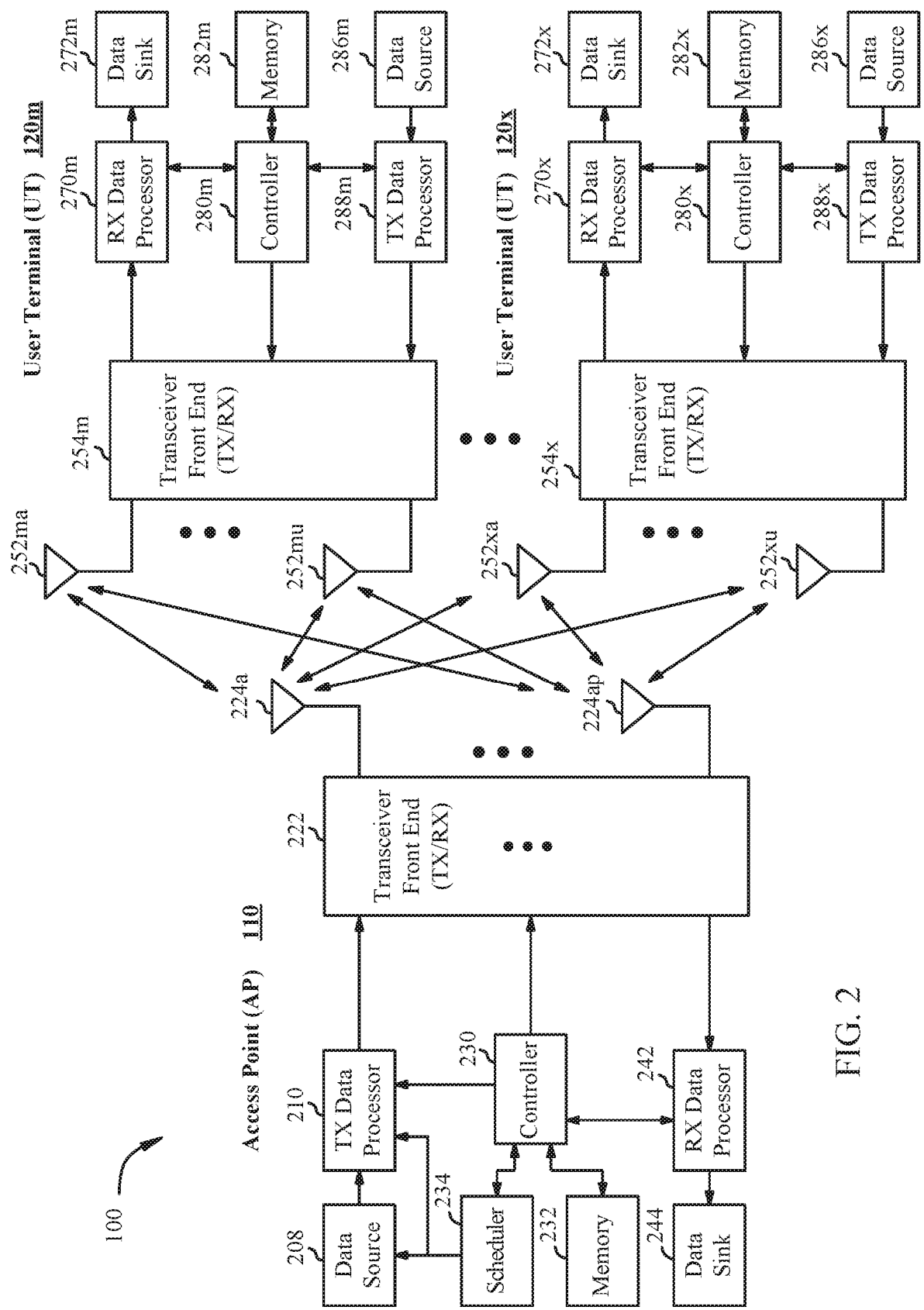
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver front end (TX/RX) 222 of access point 110 and/or transceiver front end 254 of user terminal 120 may include a tunable active filter coupled to a negative transconductance circuit.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
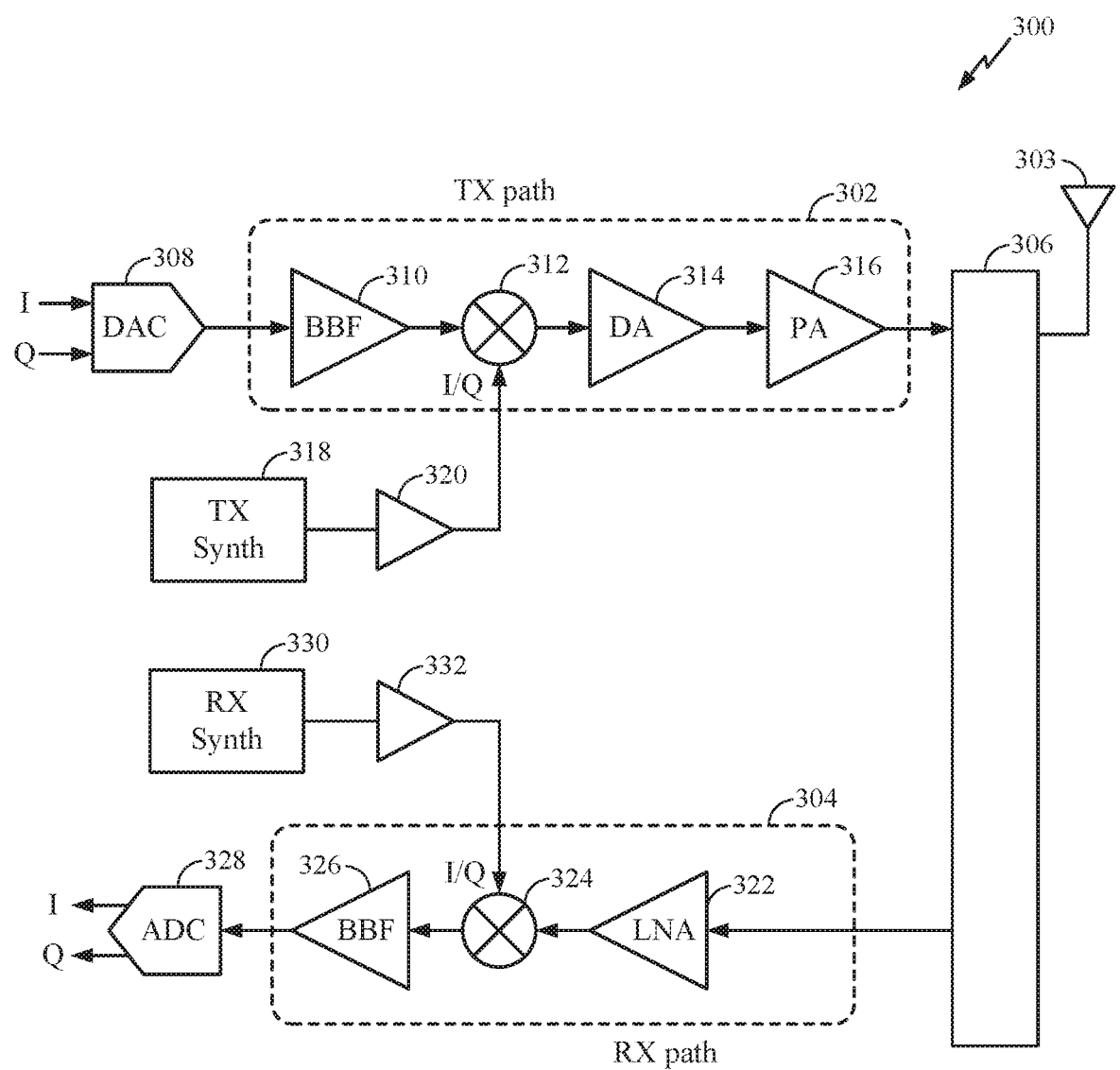
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. In some aspects of the present disclosure, the BBF 310 may include a tunable active filter as described below. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. In some aspects of the present disclosure, the BBF 326 may include a tunable active filter as described below. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

Example Biquad Filter for Oscillation

There are many different circuit topologies for implementing filters in electronic circuits, such as a baseband filter (e.g., BBF 310 or 326) in a receive chain or a transmit chain of a radio frequency front-end. One example filter topology using one or more amplifiers (i.e., an active topology) is referred to as a biquadratic (or biquad) filter. A biquad filter is a type of linear filter for implementing a transfer function that is the ratio of two quadratic functions, hence the name "biquadratic." One example is the Tow-Thomas biquad filter, which is implemented with a two-integrator loop topology and can be used as either a low-pass or a bandpass filter.

Figure 4:
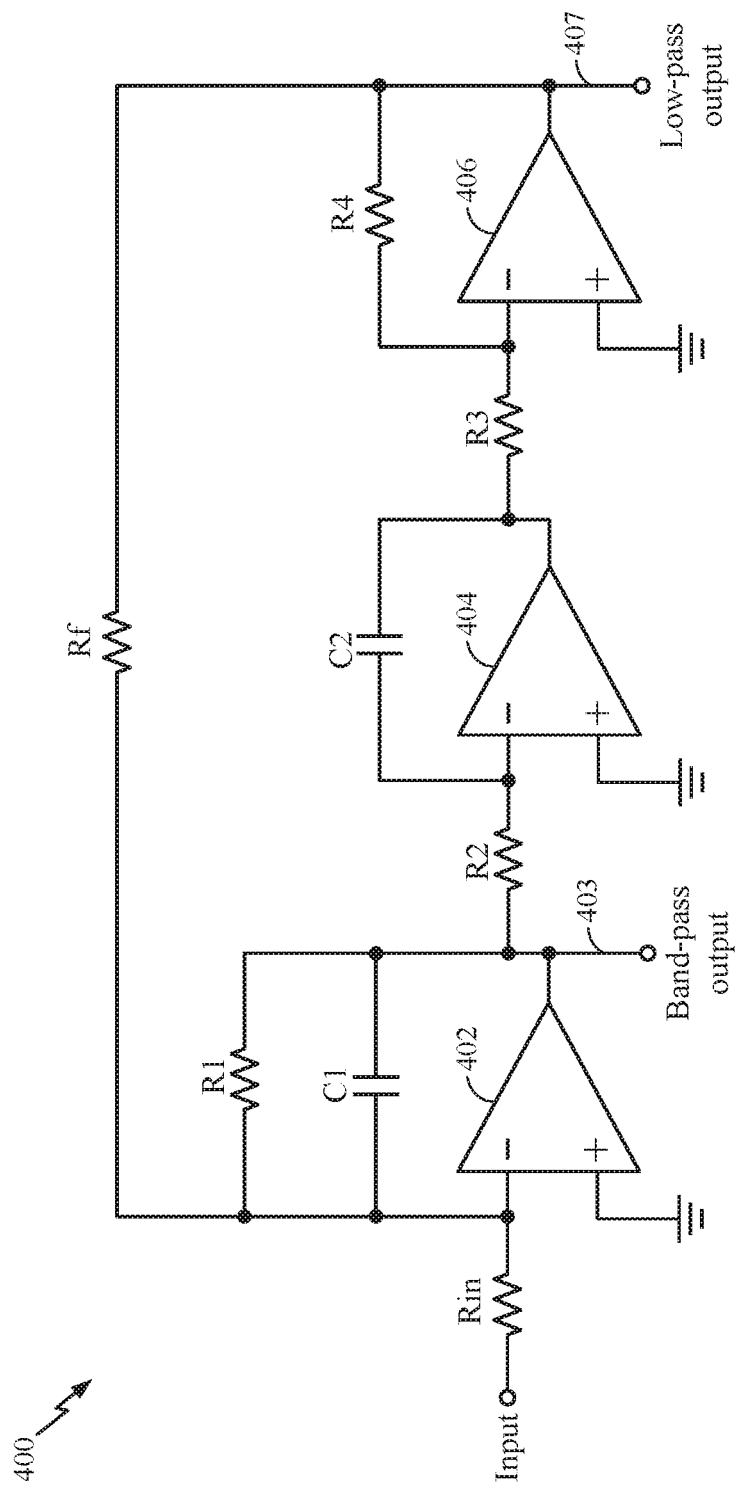
FIG. 4 is a schematic diagram of an example biquad filter, in accordance with certain aspects of the present disclosure.

FIG. 4 is a schematic diagram of an example biquad filter 400, in accordance with certain aspects of the present disclosure. In one implementation, the biquad filter 400 may comprise a Tow-Thomas biquad filter. The biquad filter 400 includes three amplifiers 402, 404, 406, which may be implemented with operational amplifiers (op amps). The positive inputs of all three amplifiers may be connected with a reference potential (e.g., electrical ground as shown). The biquad filter 400 may be implemented using a resistor-capacitor (RC) topology. For example, in certain aspects, resistor R1 and capacitor C1 may be coupled between input and output of the amplifier 402 and/or resistor R2 and capacitor C2 may be coupled to the amplifier 404, as illustrated. The resistor R1 and capacitor C1 are connected in parallel in a feedback loop, connecting the output 403 of amplifier 402 with its negative input. In some cases, the resistor R1 may be effectively disconnected from the biquad filter during an oscillation mode, as described herein. Amplifier 402, resistors Rin and R1, and capacitor C1 form the first integrator in the biquad filter 400, and the output 403 of the amplifier 402 can be used as the output of a bandpass filter implemented with the biquad filter. Amplifier 404, resistor R2, and capacitor C2 form the second integrator in the two-integrator loop topology. Amplifier 406 is used in an inverting amplifier circuit with resistors R3 and R4, where resistor R4 is in a feedback loop connecting the output 407 of the amplifier 406 with its negative input. The output 407 of amplifier 406 can be used as the output of a low-pass filter implemented with the biquad filter 400. Resistor Rf is connected in a feedback loop (also referred to as a feedback path) connecting the output 407 of amplifier 406 to the negative input of amplifier 402.

The natural frequency ($f_0$) of the biquad filter 400 is $$f_0 = \frac{1}{2\pi\sqrt{Rf * R2 * C1 * C2}}$$

The quality factor (Q) for the biquad filter 400 can be expressed as $$Q = R1 * \sqrt{\frac{C1}{C2 * Rf * R2}}$$

By making one or more components in the biquad filter 400 variable (e.g., programmable), the biquad filter can be used as a tunable filter.

Figure 5:
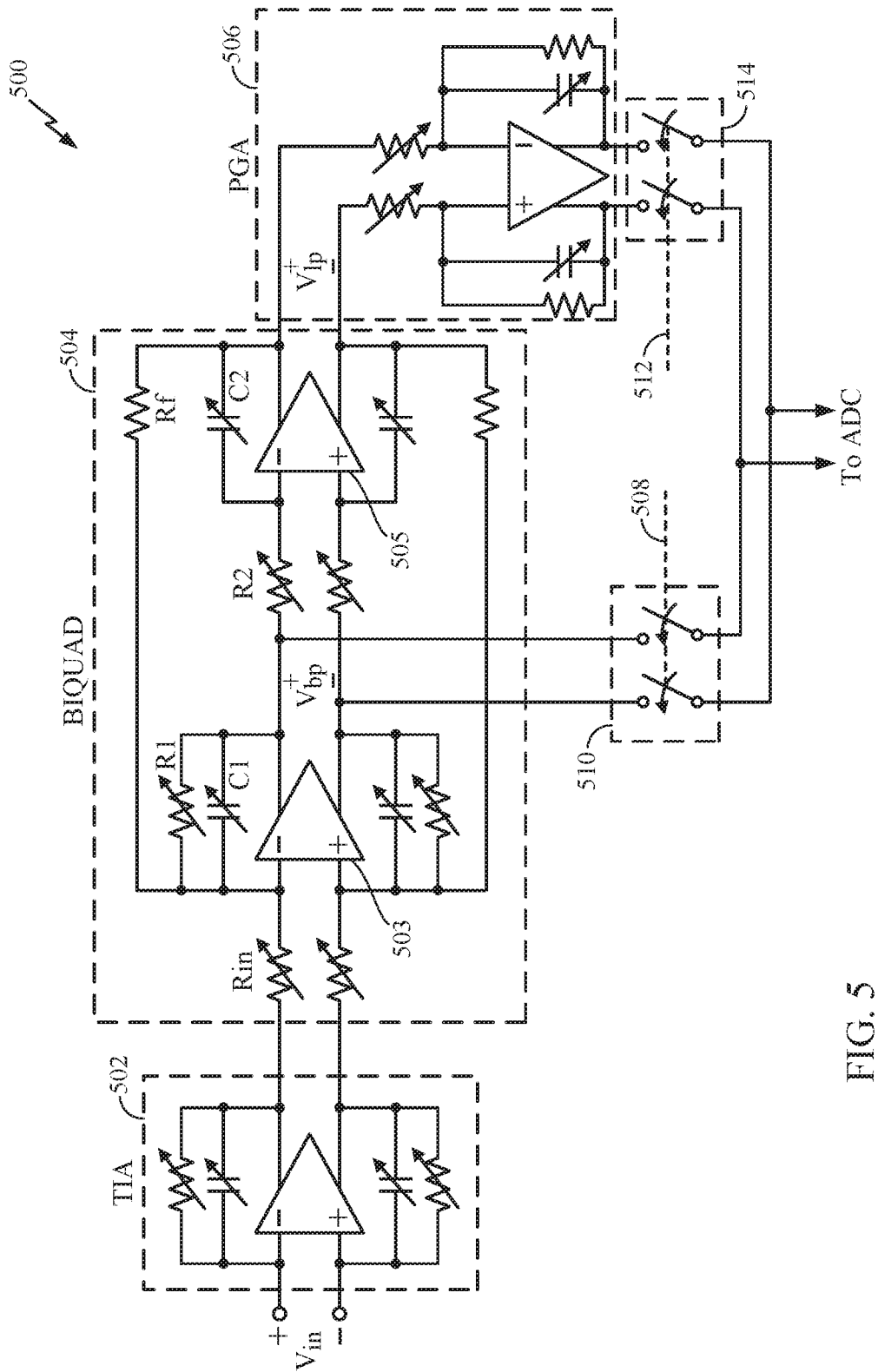
FIG. 5 is a schematic diagram of an example receive path with a transimpedance amplifier, a biquad filter, and a programmable gain amplifier, in accordance with certain aspects of the present disclosure.

FIG. 5 is a schematic diagram of an example receive path 500 with a transimpedance amplifier (TIA) 502, a biquad filter 504, and a programmable gain amplifier (PGA) 506, in accordance with certain aspects of the present disclosure. The biquad filter 504 of FIG. 5 is a differential version of the single-ended biquad filter 400 of FIG. 4 and includes differential amplifiers 503 and 505. Similar to the biquad filter 400, the biquad filter 504 may be implemented using an RC topology by coupling resistor R1 and capacitor C1 between input and output of the amplifier 503 and/or coupling resistor R2 and capacitor C2 to the amplifier 404, as illustrated. In some cases, the resistor R1 may be effectively disconnected from the biquad filter during an oscillation mode, as described herein. In some cases, the biquad filter 504 may not include an inverting amplifier, as opposed to the biquad filter 400 which includes amplifier 406 configured as an inverting amplifier with resistors R3 and R4. A control signal 508 may be used to close switches 510 and send the bandpass output Vbp of the biquad filter 504 to the ADC (e.g., ADC 328). Alternatively, another control signal 512 may be used to close switches 514 and send the low-pass output Vlp of the biquad filter 504 to the PGA 506 for amplification before being digitized by the ADC. Although the TIA 502, the biquad filter 504, and the PGA 506 are implemented as differential circuits in FIG. 5, the receive path 500 may alternatively be implemented with single-ended circuits for certain aspects. Various components in the biquad filter 504 may be programmable. For example, Rin, R1, C1, R2, and/or C2 may be variable, as illustrated in FIG. 5, such that the biquad filter 504 functions as a tunable active filter. Certain aspects of the present disclosure are generally directed to a biquad filter configurable to provide an oscillating signal in an oscillation mode of operations.

Figure 6:
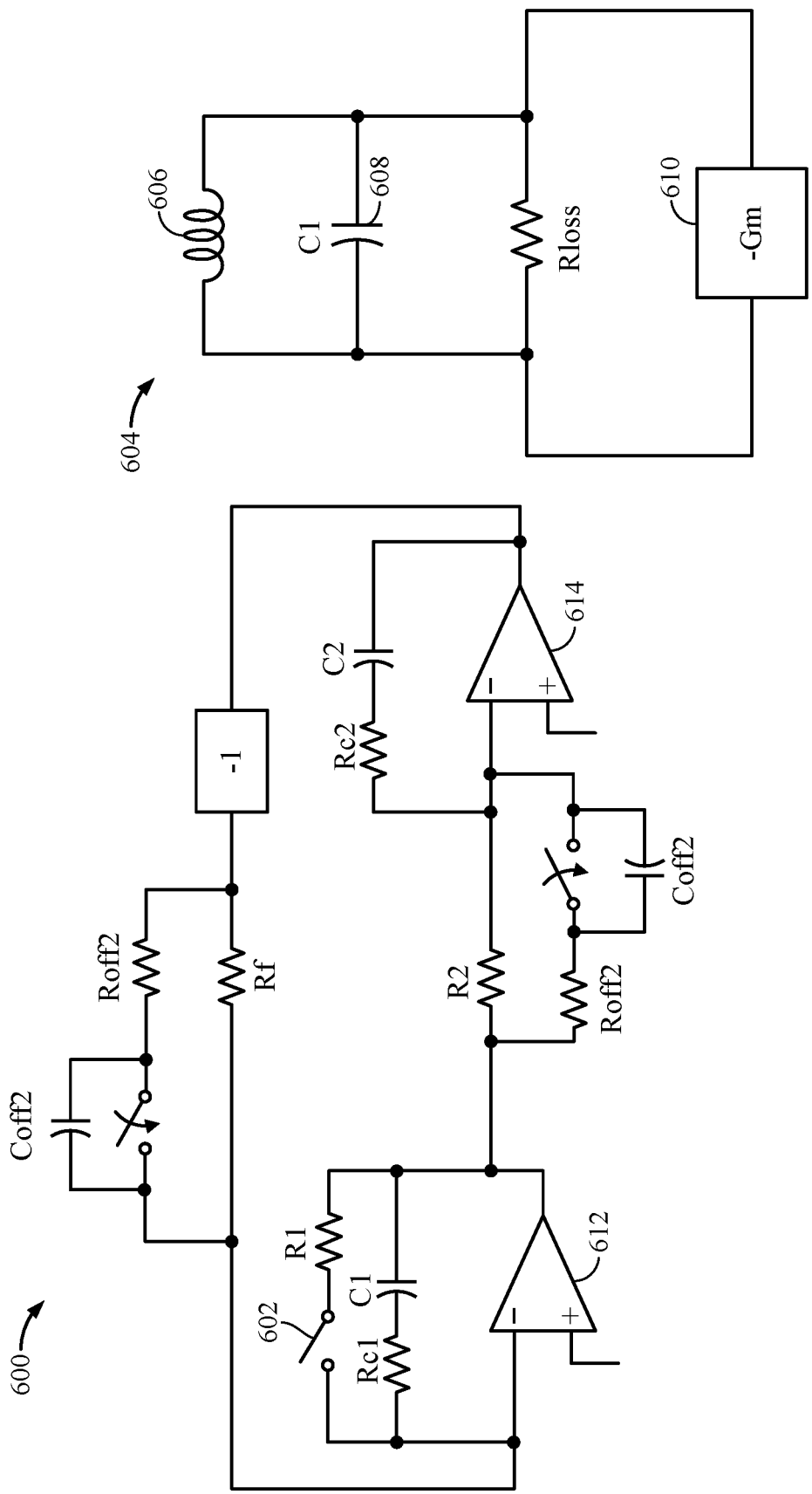
FIG. 6 is a schematic diagram of an example biquad filter having parasitic elements and configurable to operate in an oscillation mode, in accordance with certain aspects of the present disclosure.

FIG. 6 illustrates a single-ended biquad filter 600 having parasitic elements and configurable to operate in an oscillation mode, in accordance with certain aspects of the present disclosure. To enable the oscillation mode, oscillation enable switch 602 may be added to the biquad filter 600. When the switch 602 is open, the resistive element R1 is effectively disconnected from the biquad filter 600, causing the biquad filter 600 to oscillate.

Ideally, the biquad filter 600 should oscillate at a center frequency $f_0$ as defined above because the amplifiers 612 and 614 provide finite phase shift at $f_0$. To accurately match the oscillation frequency, the amplifiers 612 and 614 should not cause a great amount of phase shift at $f_0$. To build up oscillation from noise, the loop gain of the biquad filter 600 should be greater than or equal to 0 dB at $f_0$. In other words, the initial closed-loop poles should lie on the right half of the s-plane. However, the biquad filter 600 has several parasitic elements that dampen the oscillation of the biquad filter 600 in the oscillation mode. For example, the capacitors C1 and C2 may have series resistances Rc1 and Rc2. In some cases, each of the resistive elements Rf and R2 may be coupled in parallel with a switch allowing the resistive elements Rf and R2 to be bypassed. Therefore, when the switches are open, each of the resistive elements Rf and R2 may have a parallel parasitic resistance $R_{offf}$, $R_{off2}$ and a parasitic capacitance $C_{offf}$, $C_{off2}$. These parasitic elements result in extra zeros at:

$$\frac{1}{(R2 + R_{off2})C_{off2}} \text{ and } \frac{1}{(Rf + R_{offf})C_{offf}}$$

and extra poles at:

$$\frac{1}{R_{offf}C_{offf}} \text{ and } \frac{1}{R_{off2}C_{off2}}$$

which results in a phase shift at $f_0$ greater than zero, bringing the closed-loop poles to the left half of the s-plane and dampening oscillations.

The equivalent circuit 604 illustrates the equivalent impedances of the biquad filter 600. As illustrated, a parallel resistance Rloss, which is a function of Rc1 and Rc2, dampens oscillations of the inductor-capacitor (LC) tank circuit—formed by inductor 606 (e.g., having an inductance based on Rf×R2×C2) and capacitor 608 (having a capacitance C1)—and degrades the Q of the biquad filter 600. In certain aspects of the present disclosure, a negative transconductance (−Gm) circuit 610 may be coupled to the biquad filter 600 to counteract the losses associated with the parasitic elements represented by Rloss, allowing the biquad filter 600 to be used as an oscillator.

Figure 7A:
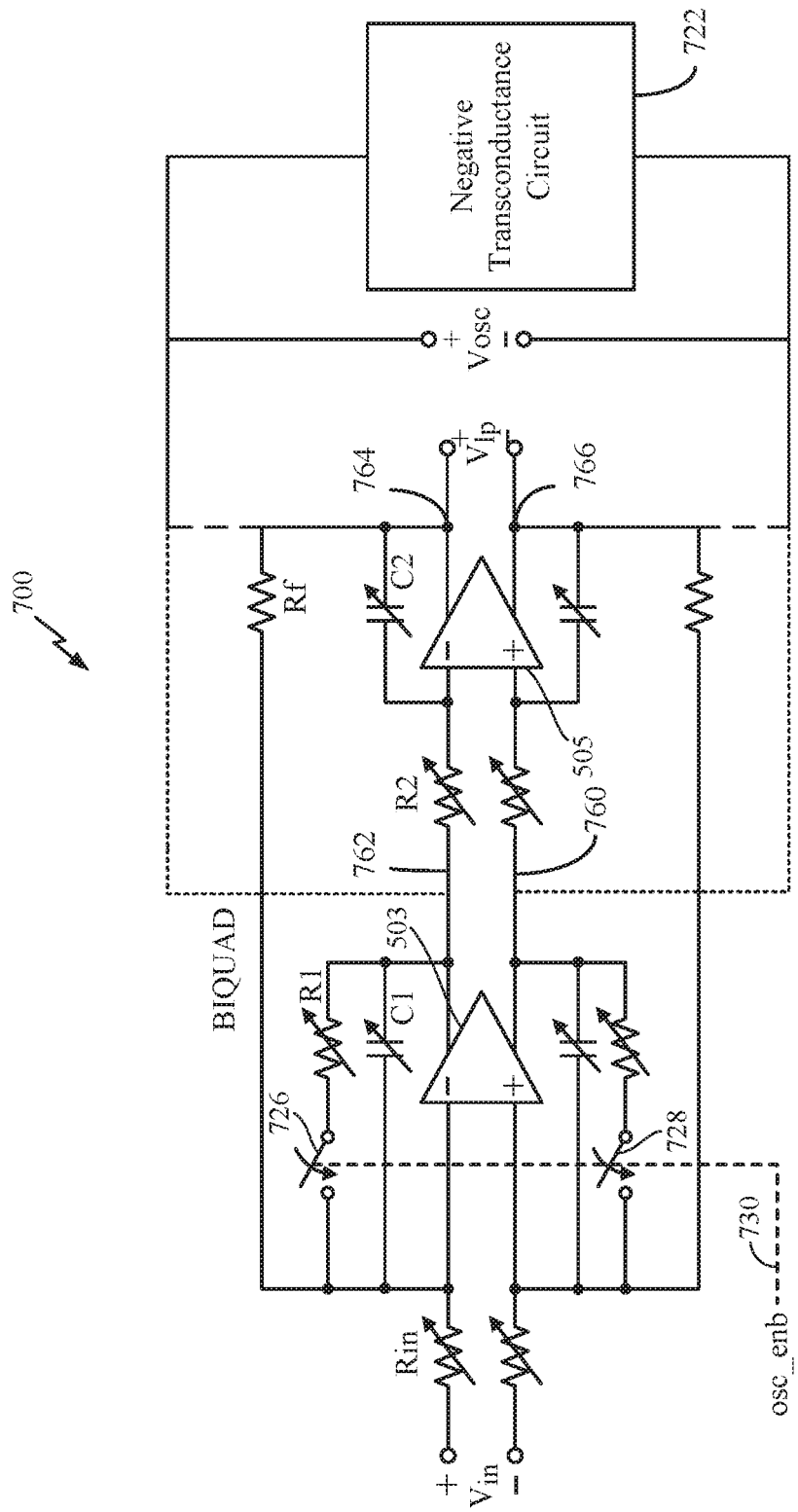
FIG. 7A illustrates an example biquad filter coupled to a negative transconductance circuit, in accordance with certain aspects of the present disclosure.

FIG. 7A illustrates a differential biquad filter 700 coupled to a −Gm circuit 722, in accordance with certain aspects of the present disclosure. In certain aspects, the −Gm circuit 722 may be coupled to nodes 760 and 762 at the outputs of amplifier 503. In other aspects, the −Gm circuit may be coupled to nodes 764 and 766 at the output (differential output pair) of amplifier 505.

To enable the oscillation mode, the oscillation enable (osc_enb) control signal 730 may be de-asserted (e.g., logic low), opening the switches 726, 728, thereby effectively disconnecting R1 from the feedback loop for the first integrator of the biquad filter 700 and causing the biquad filter to oscillate. The −Gm circuit 722 counteracts losses associated with parasitic elements of the biquad filter 700 as previously described, allowing the biquad filter 700 to generate the oscillating signal (Vosc). The oscillating signal Vosc may be output at nodes 760 and 762 if the −Gm circuit 722 is coupled to nodes 760 and 762, or may be output at nodes 764 and 766 if the −Gm circuit 722 is coupled to nodes 764 and 766.

Figure 7B:
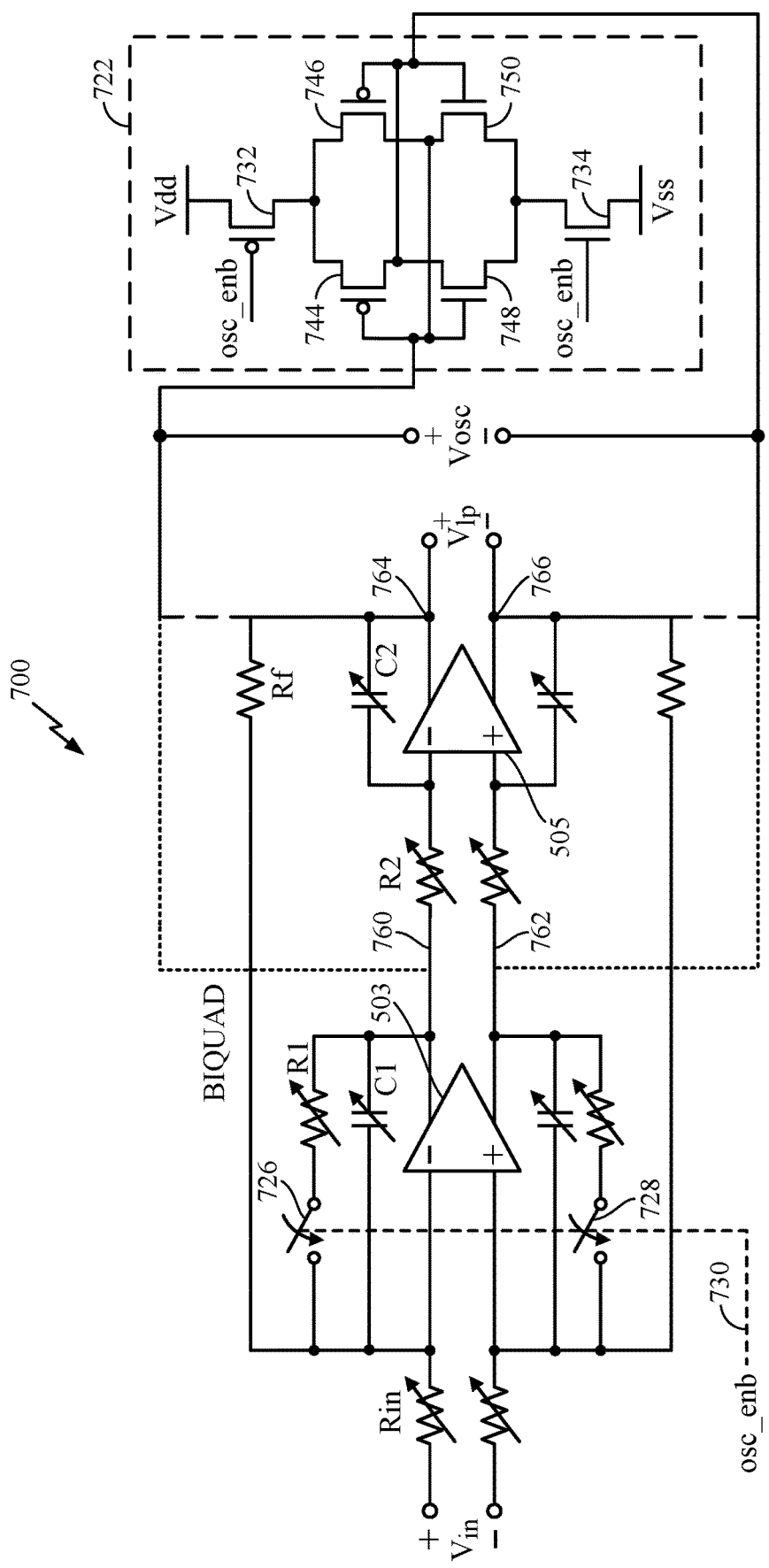
FIG. 7B illustrates an example negative transconductance circuit, in accordance with certain aspects of the present disclosure.

FIG. 7B illustrates an example −Gm circuit 722, in accordance with certain aspects of the present disclosure. The example −Gm circuit 722 includes cross-coupled p-channel metal-oxide semiconductor (PMOS) transistors 744 and 746. For example, the gate of PMOS transistor 744 is coupled to the drain of PMOS transistor 746, and the gate of PMOS transistor 746 is coupled to the drain of PMOS transistor 744. The −Gm circuit 722 also includes cross-coupled n-channel metal-oxide semiconductor (NMOS) transistors 748 and 750, as illustrated. The gates of PMOS transistor 744 and NMOS transistor 748 are coupled together, and the gates of PMOS transistor 746 and NMOS transistor 750 are coupled together. The sources of PMOS transistors 744 and 746 may be selectively coupled to a first voltage rail (e.g., Vdd) through a switch 732, and the sources of NMOS transistors 748 and 750 may be selectively coupled to a second voltage rail (e.g., Vss) through a switch 734. In certain aspects, the switch 732 may be implemented with a PMOS transistor, and the switch 734 may be implemented with an NMOS transistor. The switches 732 and 734 may be controlled by the osc_enb and osc_en control signals, respectively, where osc_en is the inverse of osc_enb. While FIG. 7B provides one type of −Gm circuit to facilitate understanding, any type of −Gm circuit may be used (e.g., using cross-coupled inverters or differential inverters).

Example Technique for Q-Tuning

A tunable active filter with high Q (e.g., >1.5) and high center frequency ($f_0$) (e.g., >20 MHz) may be very sensitive to process, mismatch, and op amp imperfections. Calibrating each center frequency with high accuracy (e.g., 200 kHz) and Q for the filter provides a desired shaping of the frequency responses across the frequency range. One conventional methodology involves calibrating the filter with the help of a single tone generator (STG) and a fast Fourier transform (FFT) engine. The STG and FFT engine may sweep the frequency across the entire bandwidth with the accuracy desired and then tweak the filter parameter to reach the target center frequency. After reaching the center frequency, such systems may determine the −3 dB bandwidth again to determine the Q and thus tweak the filter parameter. This method can be very costly in terms of hardware area and cost, power consumption, and memory usage. Also, reaching the exact center frequency involves a large number of iterations and may be prone to error.

Certain aspects of the present disclosure provide techniques and apparatus for calibrating a tunable active filter without sweeping the frequency across the entire bandwidth and without determining a bandwidth (e.g., the −3 dB bandwidth) for each center frequency using a frequency sweep. In some cases, to calibrate the various center frequencies and the Q for each $f_0$, the biquad filter may be configured to oscillate during calibration. To enable this oscillation mode, oscillation enable switches 726, 728 may be added to the biquad filter 700 illustrated in FIG. 7B. When the oscillation enable (osc_enb) control signal 730 is de-asserted (e.g., logic low), the switches 726, 728 may be opened, thereby effectively disconnecting R1 from the feedback loop for the first integrator of the biquad filter 700 and causing the biquad filter to oscillate. The voltage of the oscillating signal (Vosc) may be sampled by the ADC by, for example, closing the switches 510 with the control signal 508, as described above.

Figure 8:
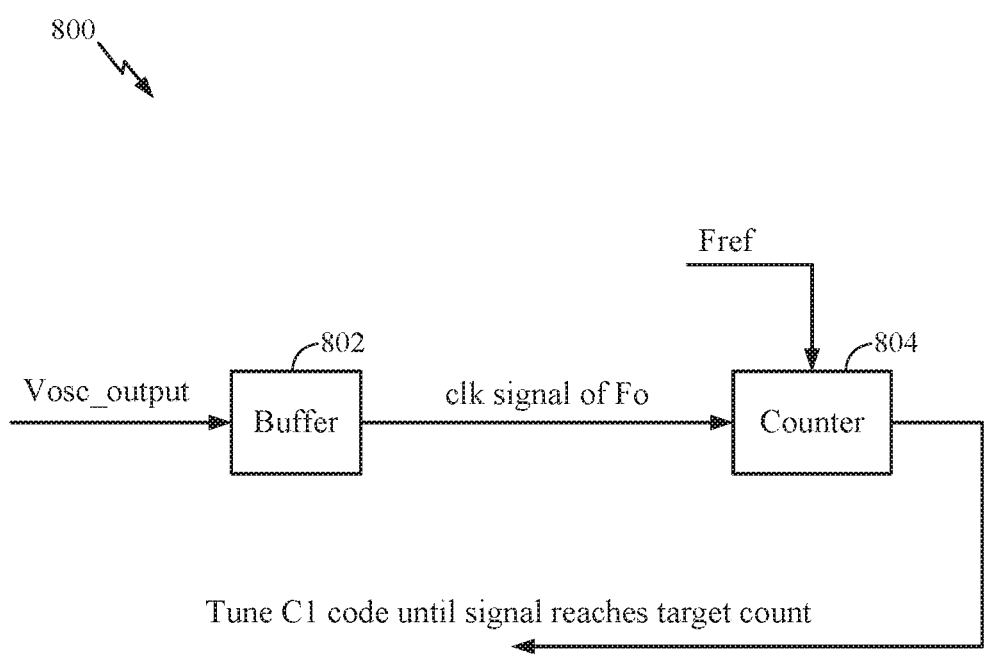
FIG. 8 illustrates example digital logic for determining the frequency of an oscillating signal output by a tunable active filter for calibration, in accordance with certain aspects of the present disclosure.

The frequency of the sampled oscillating signal may be determined, and a value of a programmable component in the biquad filter (e.g., the capacitance of capacitor C1) may be adjusted until the sampled oscillating signal substantially equals the target center frequency. Any of various suitable techniques may be used to determine the frequency of the oscillating signal. For example, FIG. 8 illustrates example digital logic 800 for determining the frequency of the oscillating signal output by a tunable active filter to calibrate a variable capacitor (e.g., C1) in the tunable active filter, in accordance with certain aspects of the present disclosure. The digital logic 800 may be interfaced with the digitized output of the ADC, and may be incorporated in a digital signal processor (DSP), for example. The digital logic 800 may include a buffer 802 and a counter 804. The buffer 802 may receive the digitized oscillating signal and output a buffered version thereof. The buffered version of the oscillating signal may be input to the counter 804 and compared against a reference frequency signal. The reference frequency signal may be provided by a crystal oscillator, for example. The counter 804 may output a tuning code for the variable capacitor based on the actual count of the buffered version of the oscillating signal, such that the variable capacitor may be tuned to adjust the oscillating signal until the count for the buffered version of the oscillating signal reaches the target count corresponding to the target center frequency for the filter. In this manner, a center frequency may be calibrated, and this method may be repeated to calibrate other center frequencies using a different target center frequency.

In some cases, once the initial center frequency ($f_n$) has been calibrated by adjusting the programmable component in the tunable active filter, the Q associated with this center frequency may be initially tuned using an STG and an FFT engine to determine the bandwidth (e.g., the −3 dB bandwidth) for one of the center frequencies. The frequency sweep need not be performed for the entire frequency range of the tunable active filter; instead, the frequency sweep for the initial Q calibration may be performed for a relatively smaller frequency range that includes the initial center frequency. Furthermore, Q need not be tuned again using this method (i.e., involving the STG and the FFT engine) for the other center frequencies. The initially calibrated value of Q can be used to calculate the Q for other center frequencies, as illustrated in FIG. 9.

Figure 9:
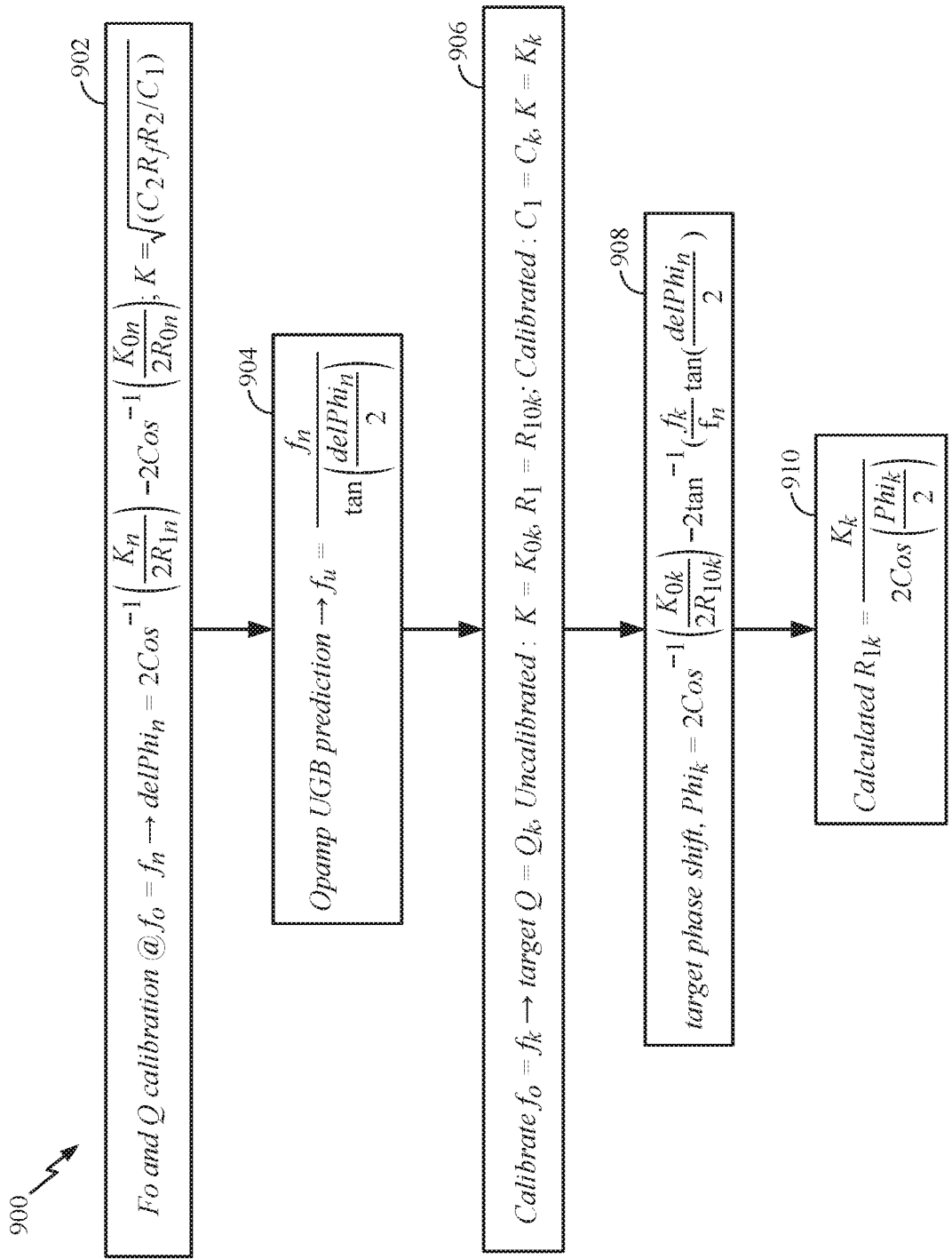
FIG. 9 is a flow diagram of example operations for calibrating the quality-factor (Q) for a tunable active filter at different center frequencies based on a formula, in accordance with certain aspects of the present disclosure.

FIG. 9 is a flow diagram of example operations 900 for calibrating the Q for a tunable active filter at different center frequencies based on a formula, in accordance with certain aspects of the present disclosure. More specifically, FIG. 9 illustrates how to determine the programmable resistance of resistor R1, which is proportional to Q as expressed above, for a target frequency ($f_k$) according to a target phase shift ($Phi_k$) and an op amp unity gain bandwidth (UGB) prediction corresponding to a given center frequency ($f_n$). The operations 900 may be performed by a circuit, which may include a tunable active filter and digital logic (e.g., a DSP).

The operations 900 may begin, at block 902, by calibrating the initial center frequency ($f_n$) and the initial quality factor (Q) as described above, by generating an oscillating signal with the biquad filter and adjusting the capacitance of programmable capacitor C1 until the oscillation frequency substantially matches the desired center frequency $F_0$. Then, after the initial Q is calibrated (e.g., using the STG and the FFT engine as described above), a phase shift ($delPHi_n$) associated with the initial $f_n$ and Q calibrations is calculated according to the following equation:

$$delPhi_n = 2\cos^{-1}\left(\frac{K_n}{2R_{1n}}\right) - 2\cos^{-1}\left(\frac{K_{0n}}{2R_{0n}}\right)$$

where $K=\sqrt{C_2 R_2/C_1}$ and is essentially the ratio of resistance $R_1$ to Q.

At block 904, the UGB of the op amp (e.g., amplifier 402 or amplifier 503) is predicted based on the initial center frequency and the phase shift calculated at block 902, according to the equation:

$$f_u = \frac{f_n}{\tan\left(\frac{delPhi_n}{2}\right)}$$

where $f_u$ is the unity gain frequency of the op amp.

At block 906, another center frequency ($f_k$) is selected for calibration with a target Q value ($Q_k$) and uncalibrated values of the ratio ($K=K_{0k}$) and programmable resistance ($R_1=R_{10k}$) as starting points. Programmable capacitor C1 may be calibrated as described above-based on adjustment of an oscillating signal from the biquad filter until the oscillation frequency equals the target center frequency—thereby yielding new calibrated values of programmable capacitance ($C_1=C_k$) and the ratio ($K=K_k$) associated with this center frequency ($f_k$).

At block 908, a target phase shift ($Phi_k$) for the center frequency ($f_k$) of interest is calculated for the op amp based on the predicted unity gain frequency ($f_u$) and the uncalibrated values of the ratio ($K=K_{0k}$) and programmable resistance ($R_1=R_{10k}$) according to the following equation:

$$Phi_k = 2\cos^{-1}\left(\frac{K_{0k}}{2R_{10k}}\right) - 2\tan^{-1}\left[\frac{f_k}{f_n}\tan\left(\frac{delPhi_n}{2}\right)\right]$$

At block 910, the calibrated value of the programmable resistance ($R_{1k}$) is calculated based on the calibrated value of the ratio ($K=K_k$) and the target phase shift ($Phi_k$), according to the following equation:

$$R_{1k} = \frac{K_k}{2\cos\left(\frac{Phi_k}{2}\right)}$$

In summary, after an initial center frequency and Q calibration, the op amp UGB is predicted. Then, a different center frequency is calibrated (e.g., C1 is adjusted), the phase shift at the op amp is predicted for this center frequency based on the UGB prediction, and this predicted phase shift is used to predict a tuning code to set for resistor R1.

Example Technique for Q-Tuning Through a Single Measurement

The operations 900 for calibrating the Q for the tunable active filter involve the use of complex formulas, which may be difficult to implement using digital logic. Certain aspects of the present disclosure provide techniques for calibrating a tunable active filter through a single measurement and using a look-up table (LUT). For example, the Q and bandwidth (BW) of the tunable active filter may be tuned at a particular fundamental frequency Fo (e.g., 42.5 MHz). A resistance value for R1 may be determined for the frequency Fo to calibrate the Q of the biquad filter. Once the resistance value of R1 has been calibrated, an error value associated with the calibration may be determined, in accordance with the following equation:

$$R1 = Rnominal + Rerror$$

where Rnominal is the nominal resistance value of R1. To calibrate other frequencies, a Q error factor may be determined based on a LUT. For each of the other frequencies, the resistance value R1 may be determined in accordance with the following equation:

$$R1 = Rnominal + Rerror \times Q \text{ error factor}$$

Figure 10:
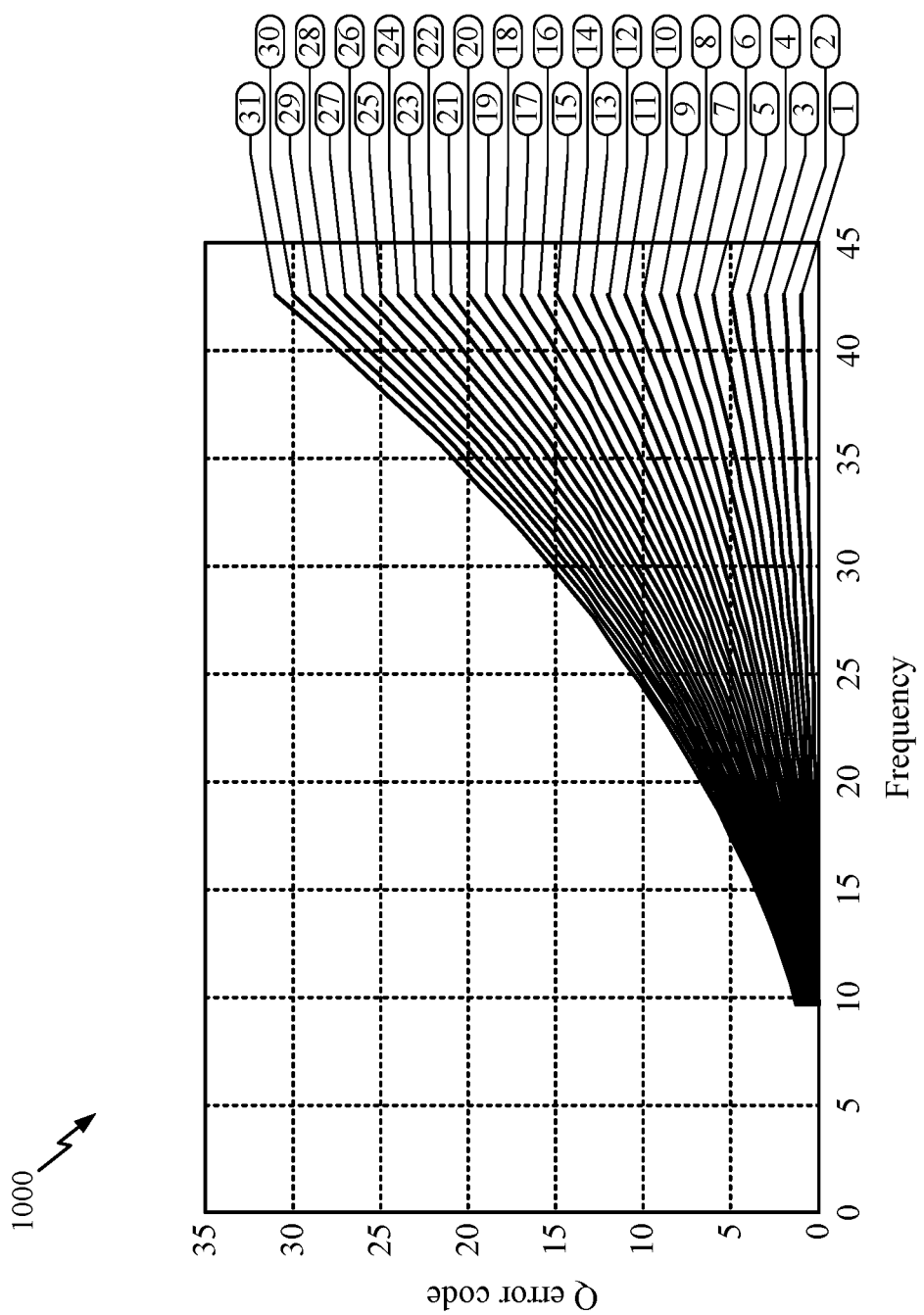
FIG. 10 is an example graph of error codes to be applied to a resistive element of a biquad filter as a function of center frequency, in accordance with certain aspects of the present disclosure.

FIG. 10 is an example graph 1000 of Q error codes (e.g., tuning codes) to be applied to R1 as a function of center frequency, in accordance with certain aspects of the present disclosure. The different curves of the graph 1000 represent the different tuning codes (e.g., 1 to 31) that can be applied to R1 and how the Q error values vary with frequency, based on calibration at an initial center frequency Fo of 42.5 MHz. As illustrated, for a given center frequency, the Q error value increases in a fairly linear manner. For example, at the center frequency of 35 MHz, the difference between the adjacent curves along the y-axis is about the same. Therefore, a LUT may be generated to provide a Q error factor for each of the frequencies that can be used to calculate the resistance value of R1 (and associated tuning code), as described above. Thus, at the initial center frequency Fo (e.g., 42.5 MHz), the Q error factor may be equal to 1, and as the frequency decreases, the Q error factor scales down accordingly.

Figure 11:
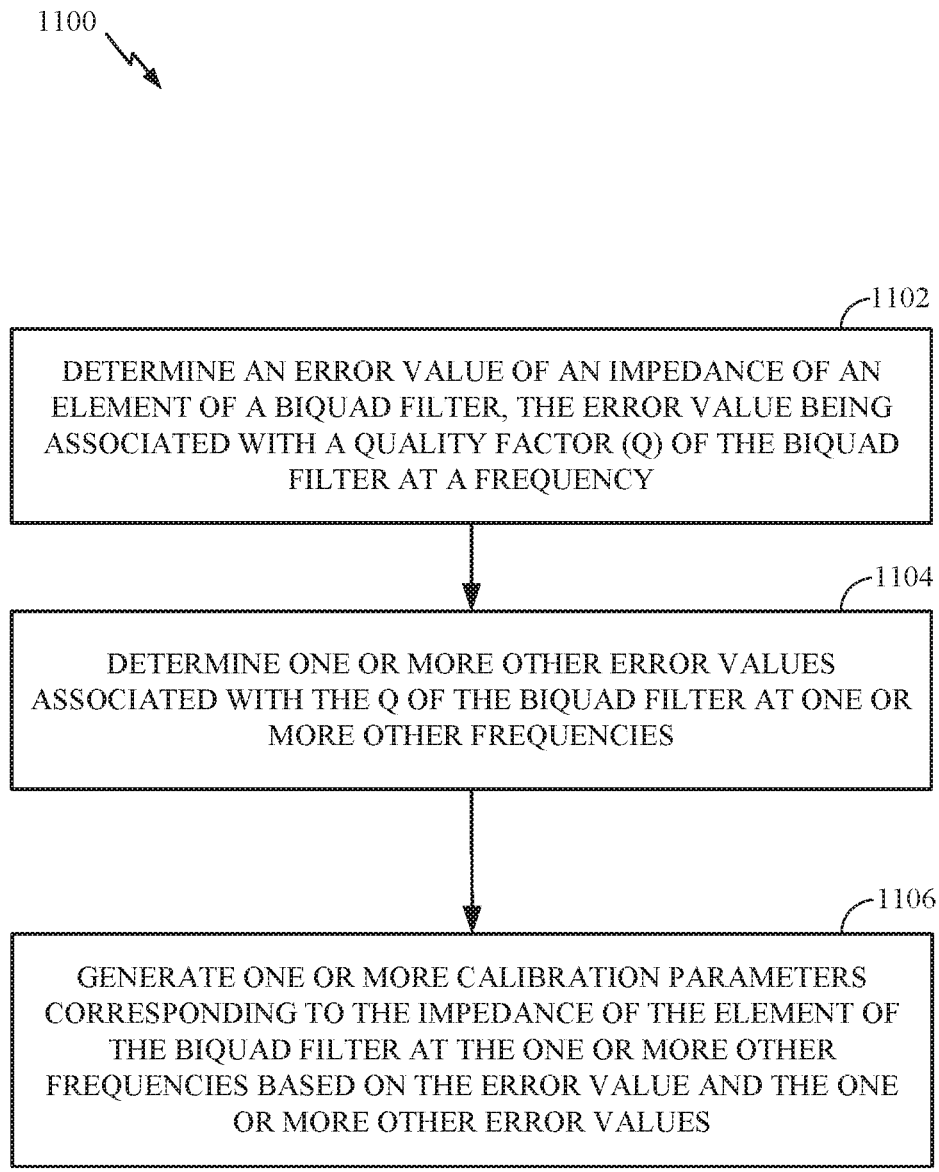
FIG. 11 is a flow diagram of example operations for generating calibration parameters for a biquad filter, in accordance with certain aspects of the present disclosure.

FIG. 11 is a flow diagram of example operations 1100 for generating one or more calibration parameters for a biquad filter, in accordance with certain aspects of the present disclosure. The operations 1100 may be performed by a calibration circuit, which may include digital hardware.

The operations 1100 may begin, at block 1102, by determining an error value (e.g., Rerror) of an impedance of an element (e.g., R1) of the biquad filter, the error value being associated with a quality factor (Q) of the biquad filter at a frequency (e.g., Fo), and at block 1104, determining one or more other error values (e.g., Q error factors) associated with the Q of the biquad filter at one or more other frequencies. At block 1106, the one or more calibration parameters corresponding to the impedance of the element of the biquad filter at the one or more other frequencies are generated based on the error value and the one or more other error values.

In certain aspects, the error value comprises a difference between the impedance of the element of the biquad filter at the frequency and a nominal impedance (e.g., Rnominal) of the element. In certain aspects, the one or more other error values are determined from a LUT that provides the one or more other error values associated with the Q at the one or more other frequencies. In certain aspects, the one or more calibration parameters may be tuning codes used to adjust the impedance of the element. For example, the calibration parameters may be stored in memory and later used to set the impedance of the element based on the operating frequency of the biquad filter 400.

In certain aspects, the biquad filter comprises a resistor-capacitor (RC) topology tunable active filter comprising a first amplifier, a second amplifier, and a feedback path coupled between an input of the first amplifier and an output of the second amplifier. For example, the biquad filter may include a first capacitive element (e.g., capacitor C1 of FIG. 5) coupled between the input of the first amplifier and an output of the first amplifier, and the element comprises a resistive element selectively coupled in parallel to the first capacitive element. In certain aspects, the biquad filter comprises a second capacitive element (e.g., capacitor C2 of FIG. 5) coupled between an input of the second amplifier and the output of the second amplifier. In certain aspects, the feedback path comprises a variable resistive element. In certain aspects, the biquad filter comprises a variable resistive element coupled between an output of the first amplifier and an input of the second amplifier. In certain aspects, the biquad filter is configured as a Tow-Thomas biquad filter. In some cases, an output of the first or second amplifier is coupled to a negative transconductance circuit, for example, as described with respect to FIGS. 6, 7A, and 7B.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, means for amplifying may include an amplifier, such as the amplifier 503 or amplifier 505. Means for providing negative transconductance may include a negative transconductance circuit, such as the negative transconductance circuit 722. Means for providing capacitance may include a capacitor, such as the capacitor C1 or C2, or a capacitive element of a transistor. Means for selectively coupling may include a switch, such as the switch 726, which may be implemented with a transistor. Means for adjusting a resistance may include a variable resistor, such as the resistor R1 or R2. Means for providing feedback may include a feedback path, such as the resistor Rf and associated conductive lines (e.g., traces).

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A filter circuit comprising:
   a resistor-capacitor (RC) topology tunable active filter comprising a first amplifier, a second amplifier, and a feedback path coupled between an input of the first amplifier and an output of the second amplifier; and
   a negative transconductance circuit coupled to a first node of the first or second amplifier of the tunable active filter.

2. The filter circuit of claim 1, wherein the first node comprises an output of the first or second amplifier.

3. The filter circuit of claim 1, wherein:
   the negative transconductance circuit is coupled to a second node of the tunable active filter;
   the first node comprises a first output of a differential output pair of the first or second amplifier; and
   the second node comprises a second output of the differential output pair of the first or second amplifier.

4. The filter circuit of claim 1, wherein:
   the negative transconductance circuit is coupled to a second node of the tunable active filter;
   the negative transconductance circuit comprises a first transistor cross-coupled with a second transistor;
   the first node is coupled to a gate of the first transistor; and
   the second node is coupled to a gate of the second transistor.

5. The filter circuit of claim 4, wherein the gate of the first transistor is coupled to a drain of the second transistor, and the gate of the second transistor is coupled to a drain of the first transistor.

6. The filter circuit of claim 4, further comprising:
   a third transistor having a gate coupled to the gate of the first transistor and a drain coupled to the drain of the first transistor; and
   a fourth transistor having a gate coupled to the gate of the second transistor and a drain coupled to the drain of the second transistor.

7. The filter circuit of claim 6, further comprising:
   a first switch coupled between a voltage rail and sources of the first and second transistors; and
   a second switch coupled between a reference potential and sources of the third and fourth transistors.

8. The filter circuit of claim 7, wherein the first and second switches are configured to be closed during an oscillation mode of the filter circuit.

9. The filter circuit of claim 8, further comprising:
   a capacitive element coupled between the input of the first amplifier and an output of the first amplifier; and
   a resistive element configured to be coupled in parallel to the capacitive element during the oscillation mode.

10. The filter circuit of claim 1, further comprising:
    a first capacitive element coupled between the input of the first amplifier and an output of the first amplifier; and
    a second capacitive element coupled between an input of the second amplifier and the output of the second amplifier.

11. The filter circuit of claim 10, further comprising:
    a resistive element selectively coupled in parallel to the first capacitive element.

12. The filter circuit of claim 1, wherein the feedback path comprises a variable resistive element.

13. The filter circuit of claim 1, further comprising a variable resistive element between an output of the first amplifier and an input of the second amplifier.

14. The filter circuit of claim 1, wherein the tunable active filter is configured as a Tow-Thomas biquad filter.

15. A method for generating one or more calibration parameters for a biquad filter, comprising:
    determining an error value of an impedance of an element of the biquad filter, the error value being associated with a quality factor (Q) of the biquad filter at a frequency, wherein the error value comprises a difference between the impedance of the element of the biquad filter at the frequency and a nominal impedance of the element;
    determining one or more other quality error factor values associated with the Q of the biquad filter at one or more other frequencies; and
    generating the one or more calibration parameters corresponding to the impedance of the element of the biquad filter at the one or more other frequencies based on the error value and the one or more other quality error factor values.

16. The method of claim 15, further comprising storing the one or more calibration parameters in a memory of an apparatus comprising the biquad filter.

17. The method of claim 15, wherein the element comprises a resistive element, and wherein the impedance comprises a resistance of the resistive element.

18. The method of claim 15, wherein the one or more other quality error factor values are determined from a look-up table that provides the one or more other quality error factor values associated with the Q at the one or more other frequencies.

19. The method of claim 15, wherein the biquad filter comprises a resistor-capacitor (RC) topology tunable active filter comprising a first amplifier, a second amplifier, and a feedback path coupled between an input of the first amplifier and an output of the second amplifier.

20. The method of claim 19, wherein:
the biquad filter comprises a first capacitive element coupled between the input of the first amplifier and an output of the first amplifier; and
the element comprises a resistive element selectively coupled in parallel to the first capacitive element.

21. The method of claim 20, wherein the biquad filter comprises a second capacitive element coupled between an input of the second amplifier and the output of the second amplifier.

22. The method of claim 19, wherein an output of the first or second amplifier is coupled to a negative transconductance circuit.

23. The method of claim 15, wherein the biquad filter is configured as a Tow-Thomas biquad filter.

24. An apparatus for generating an oscillating signal, comprising:
first means for amplifying an input signal;
second means for amplifying an output signal of the first means for amplifying, the input signal being based on a feedback signal generated based on an output of the second means for amplifying, and the first and second means for amplifying being part of a tunable active filter having a resistor-capacitor (RC) topology; and
means for providing negative transconductance at a first node of the first means for amplifying or the second means for amplifying to counteract losses of the tunable active filter to generate the oscillating signal.

25. The apparatus of claim 24, wherein the first node comprises an output of the first means for amplifying or the output of the second means for amplifying.

26. The apparatus of claim 25, wherein:
the means for providing negative transconductance is configured to provide the negative transconductance at a second node of the tunable active filter;
the first node comprises a first output of a differential output pair of the first or second means for amplifying; and
the second node comprises a second output of the differential output pair of the first or second means for amplifying.

27. The apparatus of claim 24, further comprising means for providing the feedback signal to an input of the first means for amplifying.

28. The apparatus of claim 24, further comprising:
means for providing electrical resistance; and
means for selectively coupling the means for providing electrical resistance between an input of the first means for amplifying and an output of the first means for amplifying.

29. The apparatus of claim 24, further comprising means for adjusting a resistance between an output of the first means for amplifying and an input of the second means for amplifying.

* * * * *